United States Patent [19]

Bank

[11] Patent Number: 5,412,664
[45] Date of Patent: May 2, 1995

[54] INTEGRATED CIRCUIT AND METHOD OF TESTING

[75] Inventor: Douglas Bank, Evanston, Ill.

[73] Assignee: Motorola, Inc., Schaumburg, Ill.

[21] Appl. No.: 996,238

[22] Filed: Dec. 23, 1992

[51] Int. Cl.$^6$ .................... H04B 17/00; G05B 23/02
[52] U.S. Cl. .................... 371/22.6; 324/73.1; 364/579; 371/22.1
[58] Field of Search ........... 324/73.1; 364/579, 580; 371/22.1, 22.6

[56] References Cited

U.S. PATENT DOCUMENTS

| 3,082,374 | 3/1963 | Buuck | 364/579 X |
| 3,487,304 | 12/1969 | Kennedy | 324/73.1 |
| 4,724,378 | 2/1988 | Murray et al. | 371/22.6 X |
| 4,897,842 | 1/1990 | Herz et al. | 371/22.4 |
| 5,177,630 | 1/1993 | Gautzoulis et al. | 371/27 X |
| 5,193,092 | 3/1993 | Hartoog et al. | 371/22.4 |

*Primary Examiner*—Edward R. Cosimano
*Attorney, Agent, or Firm*—Timothy W. Markison; James A. Coffing

[57] ABSTRACT

An improved integrated circuit (IC) comprises test logic circuitry operably coupled to a serial port, multiplexing circuitry coupled to the output of the IC and a data bus, and gating circuitry coupled to logic sections of the IC and the data bus. The IC may be tested by providing test parameters to the IC which includes identification of a particular logic circuit to be tested and test vectors for the particular logic circuit. Next, access is provided to the data bus for the particular logic circuit based on the test parameters. Finally, external test equipment is provided access to part of the data bus based on the test parameters such that the external testing equipment monitors data placed on the data bus by the particular logic section.

18 Claims, 2 Drawing Sheets

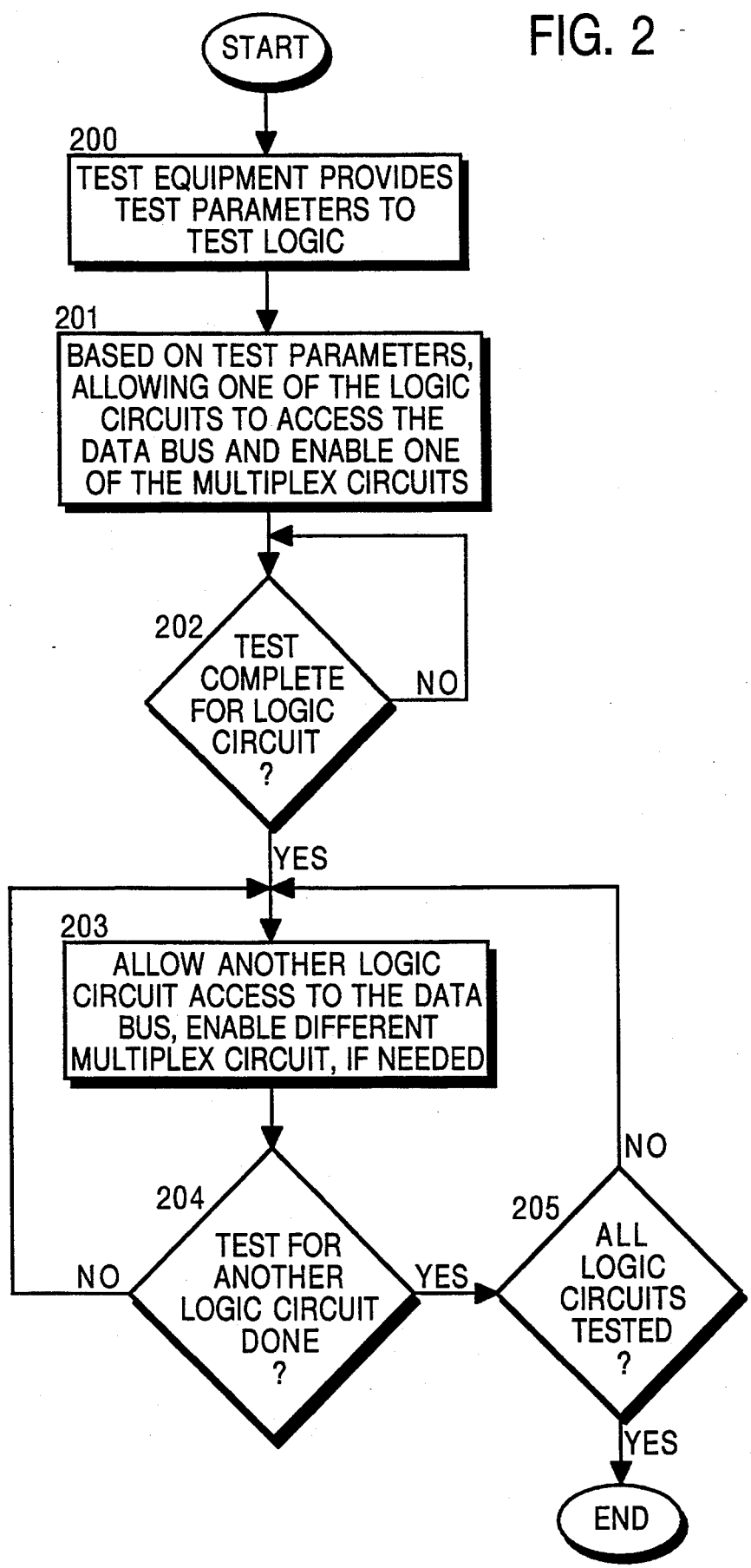

INTEGRATED CIRCUIT AND METHOD OF TESTING

FIELD OF THE INVENTION

This invention relates generally to testing of logic circuits and, in particular, to testing of logic circuits that comprise a serial port and a data bus.

BACKGROUND OF THE INVENTION

Integrated circuits (ICs) are known to comprise a limited number of logic circuits, a data bus and a serial port. As is known, internal points of an IC are tested after manufacturing to insure proper functionality. This is typically done by introducing test vectors into the IC and probing output pins along the IC for an expected result. While this method is effective, it only allows testing of those parts of the IC directly and indirectly accessible from the outside of the IC via the IC pins. Also, some parts of the IC cannot be practically tested due to the substantial number of test vectors needed to probe these parts of the IC. Further, the possibility exists than an expected response could be generated by more than one section of the logic circuit leading to ambiguous test results. Still further this method of testing only accommodates static testing; i.e. a test vector is given to the logic circuit and then, at a known time, the output pin is probed for the response.

Therefore, a need exists for an improved IC and method of testing logic circuits within the IC that is more comprehensive, efficient, and allows dynamic monitoring of the IC.

BRIEF DESCRIPTION OF THE DRAWINGS

FIG. 2 illustrates a logic diagram that can be used to implement the present invention.

DESCRIPTION OF A PREFERRED EMBODIMENT

Figure 1:
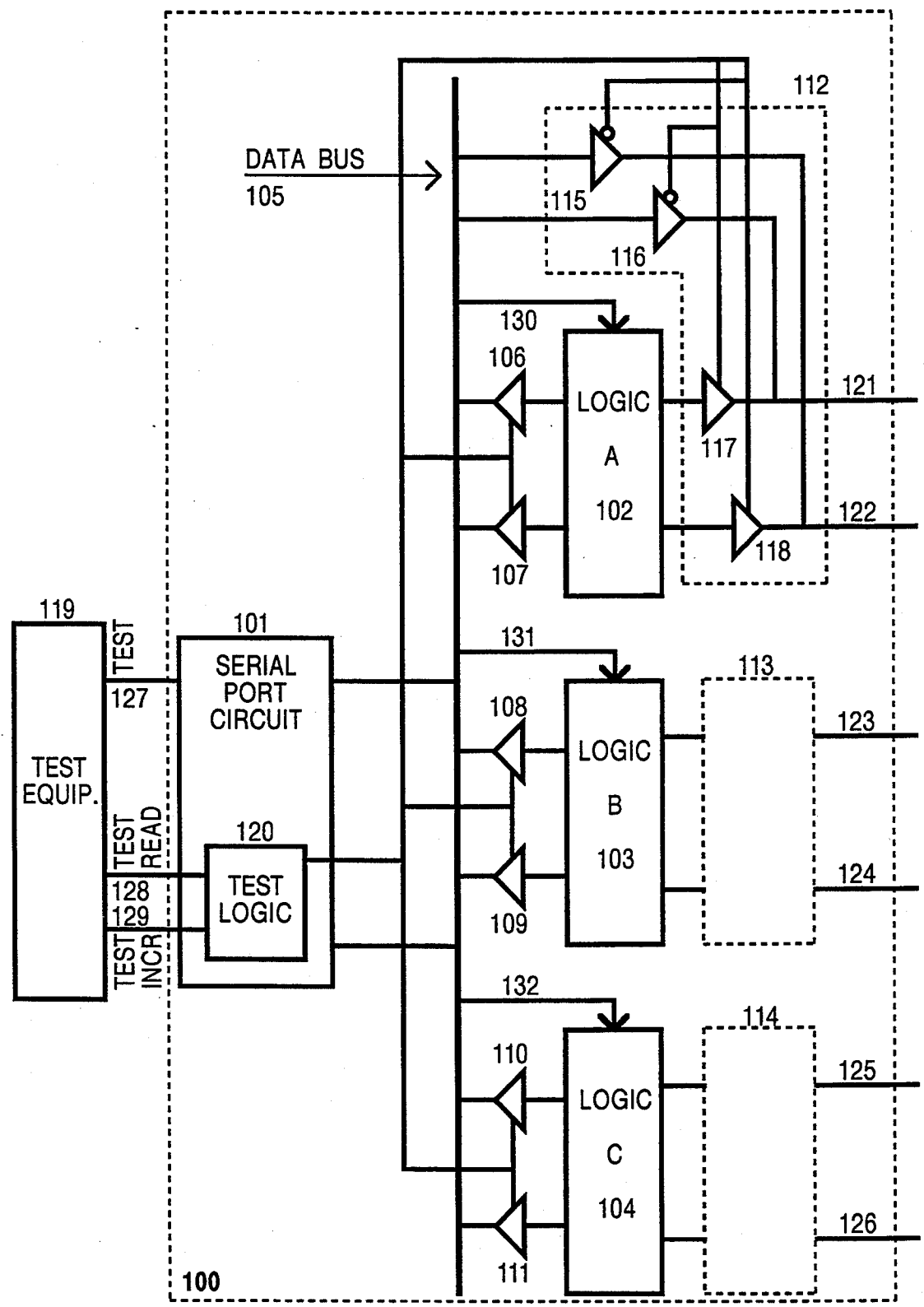
FIG. 1 illustrates a logic circuit in accordance with the present invention.

The present invention provides a method and apparatus for more comprehensive and efficient testing of integrated circuits. Generally, this is accomplished by adding gates to allow access to internal points of the integrated circuit. Based on inputted test parameters, the gates are enabled such that an internal data bus may be read by an external testing device, thus increasing the testability of the IC.

The present invention can be more fully described with reference to FIGS. 1 and 2. FIG. 1 illustrates a logic circuit 100 that comprises a serial port circuit 101, a plurality of logic sections 102-104 (only three shown), a data bus 105, a plurality of gates 106-111 (only six shown), a plurality of multiplexer circuits 112-114 (only three shown), and a plurality of input/output pins 121-126 (only six shown). The serial port circuit 101 comprises serial interface circuitry and test logic 120 which facilitates testing of the logic circuit 100. The test logic 120 contains logic necessary to control the plurality of gates 106-111, the plurality of multiplexer circuits 112-114, and the data bus 105. The inputs to the test logic, TEST 127, TEST READ 128, and TEST INCREMENT 129, provide the test equipment with direct control of the test logic. The logic sections 102-104 may comprise any combination of digital and analog circuitry that performs the intended function of the logic circuit 100. The multiplexing circuits 112-114 consist of logic and buffers 115-118 used to switch the source of output pins 121-126 from the plurality of logic sections to the data bus 105. The test equipment 119, as is known, consists of an external device used to provide stimulus to the logic circuit in the form of test vectors and measure response to the stimulus for the purpose of detecting manufacturing defects in the logic circuit.

FIG. 2 illustrates a logic diagram that can be used to implement the present invention. The process begins with the test equipment providing test parameters to the test logic 200. The test parameters are composed of stimulus needed to configure and control the serial port and test logic. More generally, the test parameters are a subset of the test vectors. The test parameters are sent to the logic circuit via the serial port and a plurality of inputs 130, 131, 132 of FIG. 1 to the logic circuit. Next, the test logic enables the data bus to access information from one or more logic sections and enables one or more multiplexing circuits to allow one or more outputs access to the data bus 201. Next, the actual testing of one or more of the logic sections is started. During the test, new test parameters can be sent by the external testing equipment to the test logic to change the speed, depth, or focus of the test. Next, check whether testing is complete for the logic section under test 202. If testing is not complete, continue testing the logic section under test. Once testing of the logic section under test is complete, new test parameters may be sent by the external testing equipment configuring the test logic, gating mechanism, and multiplexing mechanism such that another logic section may be tested 203. Next, check whether testing of the second logic section is complete 204. If testing of the second logic section is incomplete, continue testing the second logic section. Once testing of the second logic section is complete, check whether all logic sections have been tested 205. If all logic sections have not been tested, set up new test parameters by the external testing equipment for the next logic section testing. If all logic sections have been tested, the process ends. A failure during any test could cause the entire test to fail.

This invention has been incorporated into an integrated circuit manufactured by Motorola (part number 51R05835U11-CCA) for the purpose of decreasing the amount of time needed to test the IC, increasing the ability to analyze the internal logic sections of the IC, and simplifying the creation of the test vectors used to evaluate the IC. For example, this IC contains 42 separate register locations that can be accessed through the serial port. In testing the IC, all of these registers need to be read several times to analyze the integrity of the registers and the functionality of various logic sections in the IC. Without this invention, the test is accomplished using 43 consecutive data transfers via the IC's serial port and took approximately 59.4 ms to complete. With this invention, the test is accomplished using two data transfers to configure the multiplexors. Then the test equipment asserts the TEST and TEST READ inputs in order to connect the data bus to the output pins. Then one data transfer is used to select the address of the first of the 42 registers. Subsequently, 42 rising edges on the TEST INCREMENT control line causes the test logic to step through all of the register locations. The test equipment can perform this entire sequence in 17.4 ms for a time savings of 71%.

The previous example shows how the present invention can speed up existing tests. However, the present invention also tests logic sections that could not readily be tested using traditional methods. There are a multitude of circuits inside an IC that cannot be accessed directly from outside of the IC. Furthermore, there is a subset of these circuits that cannot be accessed indirectly either, i.e. through the use of test vectors. Using normal test procedures, there is no practical way to test these circuits. The present invention allows access to these untestable circuits by probing them using the data bus. For example, in the integrated circuit from the previous example there exists a circuit that consist of a number of flip-flops and combinational logic. The output of the circuit can be analyzed directly from an output pin, however, some of the internal elements of the circuit cannot be accessed from outside the IC and their operation cannot be inferred by any combination of test vectors. This invention provides access by attaching tri-state buffers to these inaccessible elements of the circuit. The buffers are attached to the IC's internal data bus. When the test of this part of the IC is being performed, the output multiplexers are configured so that the data bus can be accessed by the external test equipment, i.e. the tri-state buffers are opened and the TEST and TEST READ signals are asserted. As long as the TEST READ signal is asserted, the circuit elements can be observed and evaluated in real time.

The above describes a method and apparatus for improving the testing of ICs. By using the serial port, data bus, adding minor logic circuitry to allow access to the data bus, and multiplexing the output pins, more comprehensive and efficient testing of the logic circuits of an IC can be achieved over a prior art method of testing.

What is claimed is:

1. A logic circuit that includes a plurality of logic sections, a serial port, a data bus, a plurality of inputs operably coupled to the plurality of logic sections, and a first plurality of output buffers operably coupled to the plurality of logic sections and not coupled to the data bus, wherein a first plurality of output signals from the plurality of logic sections are routed onto the data bus for test purposes, which first plurality of output signals are not normally connected to the data bus, the logic circuit comprising:
    a plurality of output gates, operably coupled to the plurality of logic sections and the data bus;
    a second plurality of output buffers, operably coupled to the data bus;
    a plurality of output pins, operably coupled to the first plurality of output buffers and the second plurality of output buffers; and
    test logic, operably coupled to the first plurality of output buffers, the second plurality of output buffers, and the plurality of output gates, such that the test logic causes the first plurality of output signals from the plurality of logic sections to flow through the plurality of output gates, onto the data bus, through the second plurality of output buffers and onto the plurality of output pins during a first mode.

2. The logic circuit of claim 1, wherein the test logic is operably coupled to the serial port and the plurality of logic sections, and changes a source of the first plurality of output signals from a first logic section of the plurality of logic sections to a second logic section of the plurality of logic sections.

3. The logic circuit of claim 2, wherein the test logic causes a second plurality of output signals from the plurality of logic sections to flow through the first plurality of output buffers and onto the plurality of output pins during a second mode.

4. A method for testing a logic circuit, wherein the logic circuit includes a plurality of logic sections, a serial port, a data bus operably coupled to the plurality of logic sections and the serial port, a plurality of inputs operably coupled to the plurality of logic sections, and a plurality of outputs operably coupled to the plurality of logic sections, wherein a plurality of output signals from the plurality of logic sections are routed onto the data bus for test purposes, which plurality of output signals are not normally connected to the data bus, the method comprising the steps of:
    a) providing test parameters to the logic circuit, wherein the test parameters include identification of at least one of the plurality of logic sections;
    b) providing access to the data bus for a first logic section of the plurality of logic sections based on the test parameters; and
    c) providing a test circuit access to at least part of the data bus based on the test parameters, such that the test circuit monitors the plurality of output signals placed on the data bus by the first logic section.

5. The method of claim 4, further comprising the step of changing access to the data bus from the first logic section to a second logic section of the plurality of logic sections based on when the test parameters indicate that testing of the first logic section is completed.

6. The method of claim 4, further comprising the step of when the test parameters indicate that testing of the first logic section is completed, providing the test circuit access to at least part of the data bus to monitor the second logic section of the plurality of logic sections.

7. An integrated logic circuit that includes a substrate which supports a plurality of logic sections, a serial port, a data bus, a plurality of inputs operably coupled to the plurality of logic sections, and a first plurality of output buffers operably coupled to the plurality of logic sections and not coupled to the data bus, wherein a first plurality of output signals from the plurality of logic sections are routed onto the data bus for test purposes, which first plurality of output signals are not normally connected to the data bus, the integrated logic circuit comprising:
    a plurality of output gates, operably coupled to the plurality of logic sections and the data bus;
    a second plurality of output buffers, operably coupled to the data bus;
    a plurality of output pins, operably coupled to the first plurality of output buffers and the second plurality of output buffers; and
    test logic, operably coupled to the first plurality of output buffers, the second plurality of output buffers, and the plurality of output gates, such that the test logic causes the first plurality of output signals from the plurality of logic sections to flow through the plurality of output gates, onto the data bus, through the second plurality of output buffers and onto the plurality of output pins during a first mode.

8. The logic circuit of claim 7, wherein the test logic is operably coupled to the serial port and the plurality of logic sections, and changes a source of the first plurality of output signals from a first logic section of the plurality of logic sections to a second logic section of the plurality of logic sections.

9. The logic circuit of claim 8, wherein the test logic causes a second plurality of output signals from the plurality of logic sections to flow through the first plurality of output buffers and onto the plurality of output pins during a second mode.

10. A method for testing an integrated logic circuit, wherein the integrated logic circuit includes a substrate which supports a plurality of logic sections, a serial port, a data bus operably coupled to the plurality of logic sections and the serial port, a plurality of inputs operably coupled to the plurality of logic sections, and a plurality of outputs operably coupled to the plurality of logic sections, wherein a plurality of output signals from the plurality of logic sections are routed onto the data bus for test purposes, which plurality of output signals are not normally connected to the data bus, the method comprising the steps of:
a) providing test parameters to the integrated logic circuit, wherein the test parameters include identification of a first logic section of the plurality of logic sections and test vectors for the first logic section;
b) providing access to the data bus for the first logic section based on the test parameters; and
c) providing a test circuit access to at least part of the data bus based on the test parameters, such that the test circuit monitors the plurality of output signals placed on the data bus by the first logic section.

11. The method of claim 10, further comprising the step of changing access to the data bus from the first logic section to a second logic section of the plurality of logic sections based on when the test parameters indicate that testing of the first logic section is completed.

12. The method of claim 10, further comprising the step of when the test parameters indicate that testing of the first logic section is completed, providing the test circuit access to at least part of the data bus to monitor the second logic section of the plurality of logic sections.

13. A logic circuit that includes a plurality of logic sections, a serial port, a data bus, a plurality of inputs operably coupled to the plurality of logic sections, and a first plurality of output buffers coupled to the plurality of logic sections and not coupled to the data bus, wherein a first plurality of output signals from the plurality of logic sections are routed onto the data bus for test purposes, which first plurality of output signals are not normally connected to the data bus, the logic circuit comprising:
a plurality of output gates, operably coupled to the plurality of logic sections and the data bus;
a second plurality of output buffers, operably coupled to the data bus;
a plurality of output pins, operably coupled to the first plurality of output buffers and the second plurality of output buffers; and
test logic, operably coupled to the first plurality of output buffers, the second plurality of output buffers, and the plurality of output gates, such that the test logic causes at least a first output signal of the first plurality of output signals from at least one logic section of the plurality of logic sections to flow through at least one output gate of the plurality of output gates, onto the data bus, through at least one output buffer of the second plurality of output buffers and onto at least a first output pin of the plurality of output pins during a first mode.

14. The logic circuit of claim 13, wherein the test logic causes at least one output signal of a second plurality of output signals to flow through at least one output buffer of the first plurality of output buffers and onto one or more output pins of the plurality of output pins during a second mode.

15. The logic circuit of claim 13, wherein the test logic causes at least one output signal of a second plurality of output signals to flow through at least one output buffer of the first plurality of output buffers and onto at least a second output pin of the plurality of output pins during the first mode.

16. The logic circuit of claim 13, wherein the test logic is operably coupled to the serial port and the plurality of logic sections, and changes a source of the first plurality of output signals from a first logic section of the plurality of logic sections to a second logic section of the plurality of logic sections.

17. The logic circuit of claim 13, wherein the test logic causes a second plurality of output signals from the plurality of logic sections to flow through the first plurality of output buffers and onto the plurality of output pins during a second mode.

18. The logic circuit of claim 13, wherein the logic circuit is disposed within an integrated logic circuit.

* * * * *